US012802944B2

(12) United States Patent
Nesarkar et al.

(10) Patent No.: US 12,802,944 B2
(45) Date of Patent: Nov. 17, 2026

(54) CHAMBER LID TEMPERATURE COOLING SYSTEM

(71) Applicant: Applied Materials, Inc., Santa Clara, CA (US)

(72) Inventors: Santosh S. Nesarkar, Bangalore (IN); Srikantha Mallappa, Bangalore (IN); Imad Yousif, San Jose, CA (US); John Anthony O'Malley, III, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 579 days.

(21) Appl. No.: 18/141,231

(22) Filed: Apr. 28, 2023

(65) Prior Publication Data

US 2024/0363313 A1 Oct. 31, 2024

(51) Int. Cl.

*H01J 37/32* (2006.01)
*C23C 16/44* (2006.01)
*C23C 16/52* (2006.01)

(52) U.S. Cl.

CPC .... *H01J 37/32522* (2013.01); *C23C 16/4411* (2013.01); *C23C 16/52* (2013.01); *H01J 2237/002* (2013.01)

(58) Field of Classification Search

CPC ........... H01J 37/32522; H01J 2237/002; H01J 2237/332–3348; C23C 16/4411; C23C 16/52; C23C 16/45591
USPC .......................................................... 118/715
See application file for complete search history.

(56) References Cited

U.S. PATENT DOCUMENTS 4,989,541 A * 2/1991 Mikoshiba ........ C23C 16/45519 118/725
6,039,812 A * 3/2000 Ellison .................... C30B 25/14 118/725
6,059,885 A * 5/2000 Ohashi .............. C23C 16/45574 118/730
6,822,185 B2 11/2004 Welch et al.
6,899,763 B2 5/2005 Pokharna et al.
(Continued)

FOREIGN PATENT DOCUMENTS

JP 2011044663 A 3/2011
KR 20090005739 A 1/2009
KR 101503439 B1 3/2015

OTHER PUBLICATIONS

Internationa Search Report and Written Opinion for Application No. PCT/US2024/011296 dated May 8, 2024.
(Continued)

*Primary Examiner* — Charlee J. C. Bennett
(74) *Attorney, Agent, or Firm* — Patterson + Sheridan, LLP

(57) ABSTRACT

An apparatus for controlling the temperature in a processing chamber for semiconductor processing is disclosed herein. In one embodiment, a baffle assembly is configured to direct air flow from a center of a lid of the processing chamber to an outer edge of the lid. The baffle assembly has a baffle center having a side surface and a bottom surface, wherein the bottom surface is ring shaped with a central opening. The baffle assembly has a middle baffle extending outward from the side surface of the baffle center. The baffle assembly has a conical baffle extending inward from the side surface of the baffle center, and a top baffle extending upward from the side surface of the baffle center.

15 Claims, 4 Drawing Sheets

(56) References Cited

U.S. PATENT DOCUMENTS

| | | | | |
|---|---|---|---|---|
| 2002/0039625 | A1* | 4/2002 | Powell | C23C 16/452 427/569 |
| 2003/0198743 | A1 | 10/2003 | Morisaki et al. | |
| 2003/0205328 | A1 | 11/2003 | Kinnard et al. | |
| 2004/0065645 | A1* | 4/2004 | Welch | H01L 21/67109 219/494 |
| 2010/0279008 | A1* | 11/2010 | Takagi | C23C 16/409 118/725 |
| 2012/0111271 | A1* | 5/2012 | Begarney | C23C 16/45565 118/724 |
| 2012/0269968 | A1* | 10/2012 | Rayner, Jr. | H01J 37/32449 118/728 |
| 2015/0279634 | A1 | 10/2015 | Pal et al. | |
| 2016/0083837 | A1* | 3/2016 | Narushima | C23C 16/34 118/725 |
| 2022/0310360 | A1* | 9/2022 | Rathi | C23C 16/452 |

OTHER PUBLICATIONS

Taiwanese Office Action for Application No. 113101368 dated Nov. 25, 2025.

* cited by examiner

CHAMBER LID TEMPERATURE COOLING SYSTEM

FIELD

The present disclosure generally relates to a method and apparatus for controlling the temperature of components of a semiconductor processing apparatus. More specifically, a temperature control system implementing a baffle for flow optimization of a variable speed blower is described herein.

BACKGROUND

One type of processing apparatus for semiconductor substrates is a single substrate processor in which one substrate at a time is supported on a susceptor in a processing chamber. The susceptor divides the chamber into two regions: an upper region bounded by an upper dome, or chamber lid, which is above the susceptor, and a lower region bounded by a lower dome, which is below the susceptor. The susceptor is generally mounted on a shaft, which rotates the susceptor about its center to enhance uniform processing of the substrate. A flow of a processing gas is provided in the top of the chamber to process the surface of the substrate. The chamber may have a gas inlet port at one side thereof, and a gas outlet port at an opposite side to achieve a flow of the processing gas across the substrate. Alternatively, the chamber lid may incorporate a gas distributor to direct process gases toward the substrate, with gases exiting at a periphery of the chamber.

The susceptor may be heated in order to heat the substrate to a desired processing temperature. One method used to heat the susceptor is by the use of lamps provided around the chamber, or heaters embed in the susceptor. When striking a plasma for processing a substrate, the temperature at the lid will increase. The temperature of the susceptor and/or the substrate may be constantly measured to control the temperature to which the substrate is being heated. The substrate temperature is controlled to afford uniform processing of substrates in the chamber. Temperature non-uniformities may lead to slip lines, stacking faults, particle generation, and defects in the substrate. As substrate processing has demanded high power plasma, the lid temperature has also increased and caused temperature gradients from edge to center of the lid which in turn effects substrate processing and may additionally damage the lid resulting in expensive chamber down time. A large temperature gradient of 60 degrees C. on the chamber lid from center to edge has resulted leading to lid failures and on-wafer non-uniformity.

It has been determined that minimizing the temperature gradient across the lid and lowering the temperature of the lid reduces damage to the lid while enhancing processing uniformity. Thus, there is a need to control the temperature and temperature uniformity across the chamber lid.

SUMMARY

An apparatus for controlling the temperature in a processing chamber for semiconductor processing is disclosed herein. In one embodiment, a baffle assembly is configured to direct air flow from a center of a lid of the processing chamber to an outer edge of the lid. The baffle assembly has a baffle center having a side surface and a bottom surface, wherein the bottom surface is ring shaped with a central opening. The baffle assembly has a middle baffle extending outward from the side surface of the baffle center. The baffle assembly has a conical baffle extending inward from the side surface of the baffle center, and a top baffle extending upward from the side surface of the baffle center.

In another embodiment, a processing chamber for semiconductor processing is provided. The processing chamber has a chamber body. The chamber body has a lid having a center and a lower dome. The lid and the lower dome define an interior volume of the processing chamber, wherein a centerline of the chamber body extends through the center of the lid and the lower dome. The chamber body has a temperature control system. The a temperature control system has a temperature sensor to measure a temperature of the lid, two or more blowers, a controller in communication with the blower and the temperature sensor, and a baffle assembly configured to direct the flow from the blow to a center of the lid and then to an outer edge of the lid. The baffle assembly has a baffle center having a side surface and a bottom surface, wherein the bottom surface is ring shaped with a central opening. The baffle assembly has a middle baffle extending outward from the side surface of the baffle center. The baffle assembly has a conical baffle extending inward from the side surface of the baffle center, and a top baffle extending upward from the side surface of the baffle center.

In another embodiment, a method for cooling a processing chamber lid is provided. The method begins by striking a plasma is in the plasma processing chamber. In a next operation a temperature of the processing chamber lid is measured with a sensor. In response to the measured temperature of the lid, the speed of a variable speed fan is adjusting directing cooling gas to a baffle assembly. The velocity of the cooling gas is increased towards a center of the lid with the baffle assembly and the cooling gas exits at the outer edge of the lid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Disclosed herein is a processing chamber having a new baffle assembly for reducing the chamber lid change in temperature from the center to edge of the lid. The new baffle assembly includes an extended and center baffles which are configured to improve cooling air flow directed to the chamber lid. The new baffle assembly, as well as a dual high-capacity 570 cfm fan, directs the air flow to the center of lid and induces turbulence in that air flow. The new baffle assembly drives heat preferentially away from the center surface of the chamber lid, thus reducing the center to edge change in temperature to less than 10 degrees Celsius. Structural analysis has been observed that the reduced temperature gradient across the lid lowers the stress generated within the lid, and improves the reliability of the chamber lid. The probability of failure for the chamber lid has been calculated and shows significant improvement over conventional techniques for cooling the chamber lid.

Figure 1:
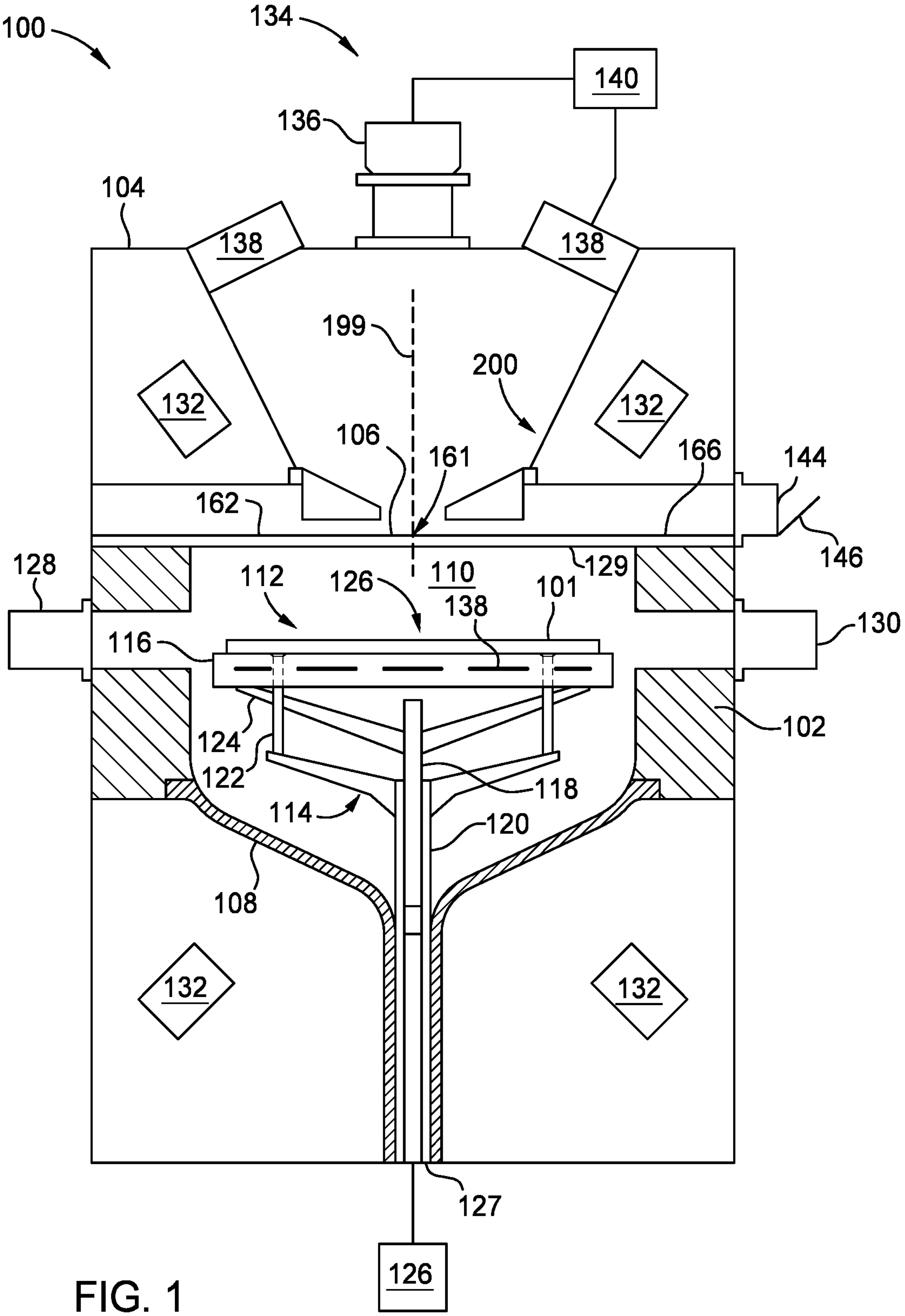
FIG. 1 illustrates a cross sectional view of one embodiment of a processing chamber having a baffle assembly for cooling.

FIG. 1 illustrates a cross sectional view of a processing chamber 100 having a baffle assembly 200 configured for enhanced cooling of a chamber lid 106, according to one embodiment. The processing chamber 100 configured for processing a substrate 101. The processing chamber 100 includes a chamber body 102, chamber lid 106, a lower dome 108, a housing 104, and a temperature control system 134. The housing 104 envelopes and supports the chamber body 102. The chamber body 102, the lid 106 and the lower dome 108 define the interior volume 110 of the processing chamber 100. A substrate support assembly 112 is positioned in the interior volume 110 of the chamber body 102.

The substrate support assembly 112 includes a support shaft system 114 and a susceptor 116. The support shaft system 114 includes a shaft 118, a shroud 120, a plurality of lift pins 122, and a plurality of arms 124. The shaft 118 of the support shaft system 114 is positioned within the shroud 120, and both the shaft 118 and the shroud 120 extend through an opening 127 in the lower dome 108. The shaft 118 and shroud 120 extend outside the housing 104. The shaft 118 and shroud 120 may be coupled to an actuator assembly 126. The actuator assembly 126 may be configured to rotate the shaft 118 on a central axis and to move the shaft 118 and the shroud 120 along an axis of the processing chamber 100.

The plurality of arms 124 is coupled to the shaft 118. The arms 124 extend out radially to support the susceptor 116. The lift pins 122 are configured to extend through the susceptor 116 to raise or lower the substrate 101. The lift pins 122 may be coupled to the shroud 120 to provide movement for the lift pins 122. An actuator of the actuator assembly 126 may move the shroud 120, and the lift pins 122 coupled to the shroud 120, in an axial direction to raise or lower the substrate 101.

During processing, gases enter the processing chamber 100 through an entry port 128 formed in the chamber body 102. The gases are removed through an exhaust port 130 formed in the chamber body 102. The gases flow into the interior volume 110 of the processing chamber 100. A process-facing surface 129 of the lid 106, which faces the substrate 101, is frequently exposed to the processing environment and the process gases flowing through the interior volume 110.

Heat sources 132 are disposed within the housing 104, outside the chamber body 102. The heat sources 132 may be, for example, radiation bulbs. Alternately, the heat sources 132 may be resistive heaters embedded in the susceptor 116. In yet another example, the heat sources 132 may be provided in the chamber walls. It should be appreciated that the processing chamber 100 may have more or more of the heat sources in one or more of the chamber locations. The heat sources 132 are configured to provide heat to the substrate 101 for processing.

The lid 106 has a top surface 162. The lid 106 additionally has a center 161 and an outer edge 166. A centerline 199 extends through the center 161. The centerline 199 may generally be centered in the chamber body 102. The lid 106 and the lower dome 108 may be formed from a transparent material, e.g. quartz. Although the lid 106 is shown as flat in the example depicted in FIG. 1, the lid 106 may alternatively have a dome-shape or other suitable shape. The transparent material allows heat from the heat sources 132 to freely enter the processing chamber 100 to heat the substrate 101. In some embodiments, a temperature sensor 136 may be positioned outside or in the lid 106. The temperature sensor 136 may be oriented toward the susceptor 116 to view thermal radiation emitted by the substrate 101 during processing.

During processing, a plasma is formed in the interior volume 110 which may further drive the temperature of the lid 106. As a result, there may be temperature instability within the interior volume 110. Temperature instability may lead to slip lines, stacking faults, particles, and defects on the substrate 101. The temperature instability may additionally lead to damage of the lid 106. It has been determined that maintaining the lid 106 at a fixed temperature from a center to the edge is a factor in preventing damage to the lid 106. Furthermore, it has been determined that maintaining the lid 106 at a fixed temperature from a center to the edge is a factor in sustaining uniformity during substrate processing.

To maintain temperature uniformity on the lid 106, the lid 106 may be cooled by the temperature control system 134. The temperature control system 134 includes a temperature sensor 136, which may be a pyrometer, at least one variable speed blower 138, a controller 140 and a baffle assembly 200. The baffle assembly 200 is concentric with the center 161 of the lid 106. The variable speed blower 138 provides a cool air flow via a conduit, directed through the housing 104. In one example, the variable speed blower includes a pair of 570 CFM fans. The cooling air flow is directed to the center 161 of the lid 106 by the baffle assembly 200. The baffle assembly 200 then directs the flow along the top surface 162 of the lid 106 to the outer edge 166 of the lid 106. The air flow exits the housing 104 via an exhaust port 144. The cool air passes across top surface 162 of the lid 106 from the high temperature center 161 to the cooler temperature edge to reduce the temperature gradient across the top surface 162 of the lid 106 while cooling the lid 106 of the chamber body 102. The gas used to cool the lid 106 may be any convenient gas. In some cases, air may be used. The gas is typically selected to be chemically inert in the environment adjacent to the lid 106 outside the interior volume 110. Examples of gases that may be used include nitrogen, helium, argon, and combinations thereof. In one example, the gas exits the exhaust port 144 and contacts an outer baffle 146 to move the exhaust gas away from adjacent processing equipment.

Figure 2:
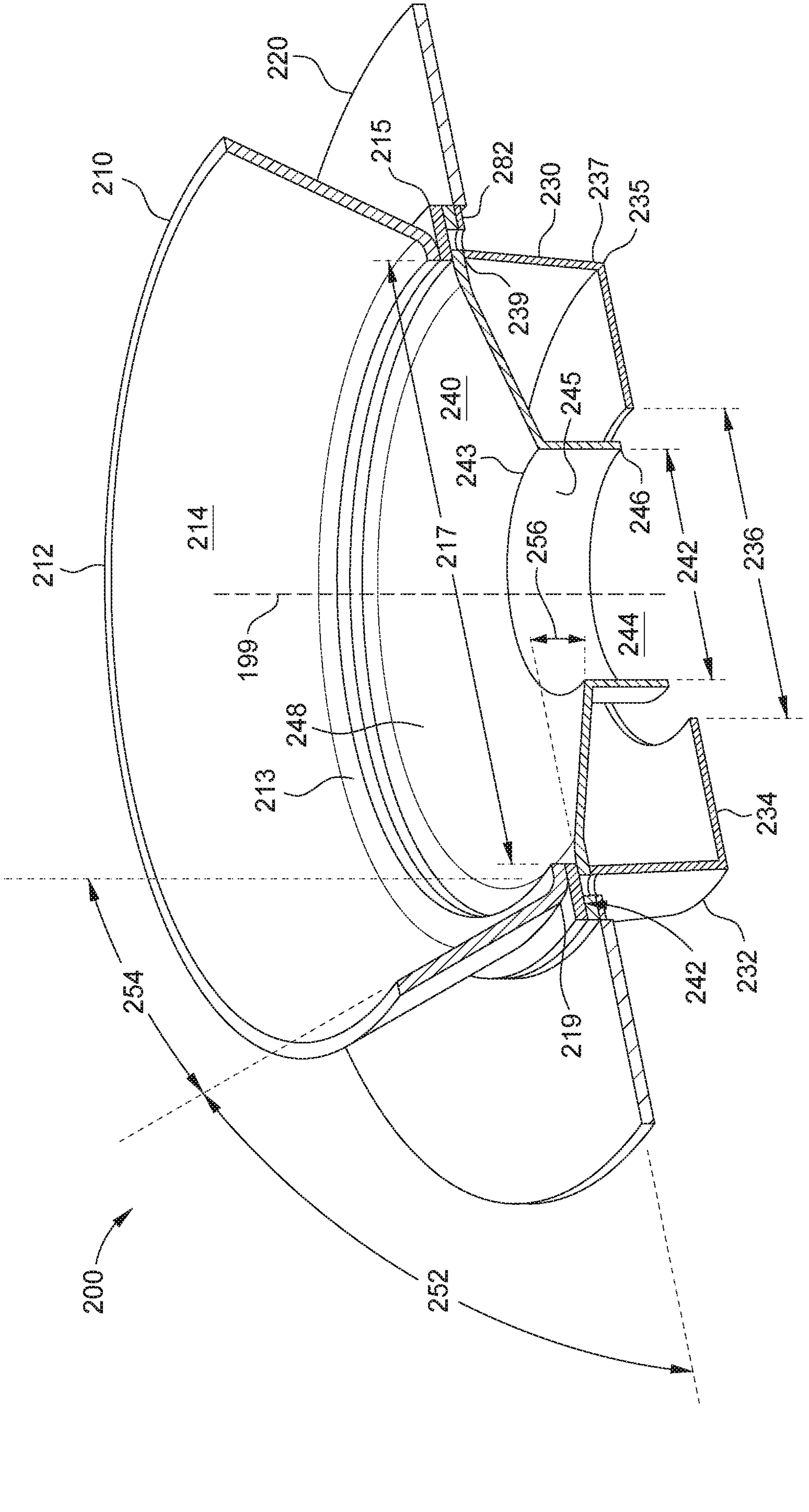
FIG. 2 illustrates one embodiment of the baffle assembly of the processing chamber in FIG. 1.

FIG. 2 is an enlarged view of the baffle assembly 200. The baffle assembly 200 is configured to increase the velocity of cooling gas directed to the center of the lid 106, which typically has the highest temperature of the lid 106. The baffle assembly 200 includes a baffle center 230, a middle baffle 220, a conical baffle 240, and a top baffle 210. Each of the baffle center 230, the middle baffle 220, the conical baffle 240, and the top baffle 210 is concentric with each other. The conical baffle 240 extends inward from the baffle center 230. The middle baffle 220 extends outward from the baffle center 230. The middle baffle 220 additionally extends outward from the conical baffle 240. The top baffle 210 extends above the baffle center 230 and the middle baffle 220. The baffle assembly 200, e.g., each of the baffle center 230, the middle baffle 220, the conical baffle 240, and the top baffle 210, may be formed from a nonconductive material. In one example, the baffle assembly 200 is formed from a plastic.

The baffle center 230 is disposed above the top surface 162 of the lid 106. The baffle center 230 is additionally centered above the lid 106. The baffle center 230 has a side surface 232 and a bottom surface 234. The bottom surface 234 may be ringed shaped with a central opening 236. The side surface 232 has a first end 237 and a second end 239. The side surface 232 extends from the first end 237 upwards from an outer edge 235 of the bottom surface 234 to the second end 239. In one example, the side surface 232 extends upwards at an angle between about +/−5° from a vertical, such as about 95° angle from the bottom surface 234. The baffle center 230 may additionally have a rim 282. The rim 282 may extend outward and away from the second end 239 of the side surface 232.

The middle baffle 220 may be coupled to the rim 282 of the baffle center 230. The middle baffle 220 may extend horizontally from the side surface 232 of the baffle center 230. In one example, the middle baffle 220 extends outward approximately perpendicular to the centerline 199. The middle baffle 220 may extend to the side wall of the housing 104 of the processing chamber 100.

The conical baffle 240 has an outer rim 242. The outer rim 242 may sit on or above the rim 282 of the baffle center 230. In one example, the outer rim 242 is directly coupled to the rim 282. The conical baffle 240 has an angle top surface 248. The angle top surface 248 extends inward from the outer rim 242 to an inner cylindrical wall 245. The angle top surface 248 additionally extends downward at an angle 256 from the outer rim 242. In one example, the angle top surface 248 extends downward from a plane of the outer rim 242, perpendicular to the centerline 199, at the angle 256 of between about 5° and about 25°, such as about 14°. Thus, angle top surface 248 has an angle from the centerline 199 of between about 85° and about 65°, such as about 76°. In this manner, a top 243 of the inner cylindrical wall 245 is vertically below the outer rim 242. A bottom to 246 of the inner cylindrical wall 245 is vertically above the bottom surface 234 of the baffle center 230. Thus, the inner cylindrical wall 245 of the conical baffle 240 has a shorter length than the side surface 232 of the baffle center 230. The conical baffle 240 has an opening 242 defined by the inner cylindrical wall 245. The opening 242 has a diameter which is smaller than the central opening 236 of the baffle center 230. The conical baffle 240 has an opening 242 defined by the inner cylindrical wall 245. The opening 242 has a diameter which is smaller than the central opening 236 of the center baffle 230. The cooling gas directed downward by the conical baffle 240 is flows down through cylindrical opening 242 and then between the top surface 162 of the lid 106 and the bottom surface 234 of the baffle center 230 towards the outlet port 144.

The baffle assembly 200 may additionally include a spacer 215. The spacer 215 may be similarly sized as the rim 282 of the baffle center 230. The spacer 215 is disposed above the rim 282. The spacer 215 may be disposed on the outer rim 242 of the conical baffle 240. The spacer 215 is configured align the top baffle 210 with the variable speed blower 138.

The top baffle 210 has a lower collar 213 and an angled sidewall 214. The angled sidewall 214 has a bottom edge 219 and a top edge 212. The angled sidewall 214 is angled 254 outward from the center axis of the baffle center 230. The angle 254 of the angled sidewall 214 may be between about 10° and about 40°, such as about 30° from a vertical center axis, i.e., centerline 199, of the baffle assembly 200. In one example, the angled sidewall 214 extends up from the plane of the outer rim 242, perpendicular to the centerline 199, at an angle 252 of about 60°. It should be appreciated that the angle 252 of the angled sidewall 214 is greater than the angle 256 of the angled top surface 248. In this manner, the top edge 212 of the top baffle circumscribes the variable speed blowers 138 for directing flow of the cooling gas or cooling air onto the angled top surface 248 and into a center 244 of the baffle assembly 200. An angle between angle top 248 and the angle sidewall 214 is between about 105° and about 155°, such as about 134°.

The lower collar 213 may extend inward from the bottom edge 219 of the angled sidewall 214. The lower collar 213 is ring shaped and extends inward from the bottom edge 219 of the angled sidewall 214. The lower collar 213 extends from the bottom edge 219 of the angled sidewall 214 along the length rim 282. The lower collar 213 has an opening 217. In one example, the opening 217 is sized similarly to an opening of the spacer 215. In another example, the opening 217 is sized similarly to an opening defined by the second end 239 of the side surface 232 of the baffle center 230. In this manner, the cooling gas, or cooling air, flowing through the opening 217 is not impeded from contacting the angle top surface 248 of the conical baffle 240.

Returning to FIG. 1, the temperature of the lid 106 may be monitored using the temperature sensor 136. The temperature sensor 136 may be a pyrometer. The temperature sensor 136 uses light having a wavelength of about 1.5 μm to about 6 μm to measure the temperature of the lid 106. The temperature sensor 136 is connected to the controller 140.

Figure 3:
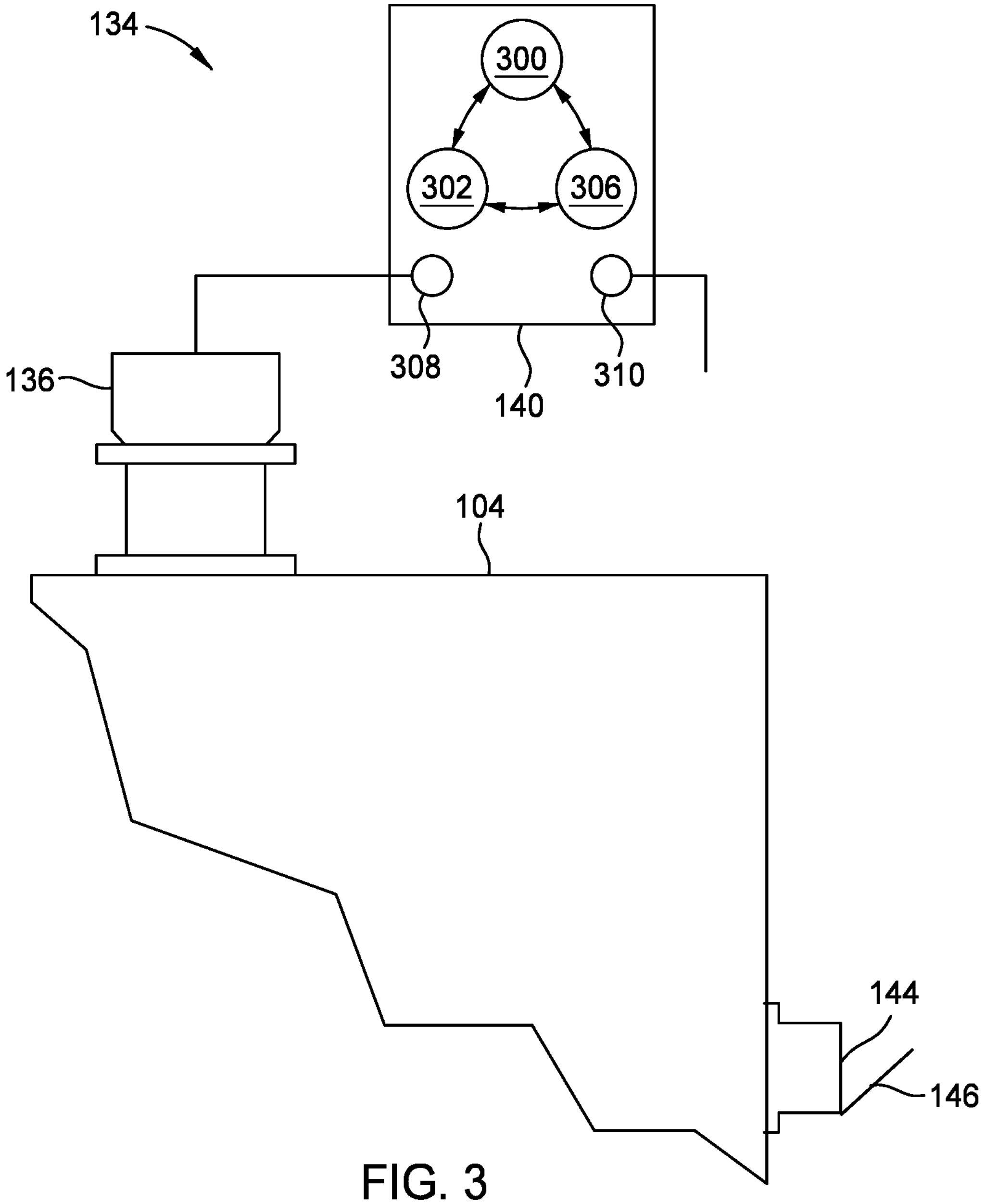
FIG. 3 illustrates one embodiment of a controller for operating the processing chamber in FIG. 1.

The controller 140 may be additionally discussed with respect to FIG. 3. FIG. 3 illustrates one embodiment of the controller 140 for operating the processing chamber 100 in FIG. 1.

The controller 140 may be used to operate all aspects of the temperature control system 134. The controller 140 includes a programmable central processing unit (CPU) 300 that is operable with a memory 302 and a mass storage device, an input control unit, and a display unit (not shown), such as power supplies, clocks, cache, input/output (I/O) circuits, and the like, coupled to the various components of the temperature control system 134 to facilitate control of the variable speed blower 138. The controller 140 also includes hardware for monitoring the temperature sensor 136. The controller 140 may also be coupled to additional sensors that measure system parameters such as substrate temperature, chamber atmosphere pressure and the like.

To facilitate operation of the temperature control system 134 described above, the CPU 300 may be one of any form of general purpose computer processor that can be used in an industrial setting, such as a programmable logic controller (PLC), for controlling the variable speed blower 138 based on data from the temperature sensor 136. The memory 302 is coupled to the CPU 300. The memory 302 is non-transitory and may be one or more readily available memory types such as random access memory (RAM), read only memory (ROM), floppy disk drive, hard disk, or any other form of digital storage, local or remote. Support circuits 306 are coupled to the CPU 300 for supporting the processor in a conventional manner. Process information is generally stored in the memory 302, typically as a software routine. The software routine may also be stored and/or executed by a second CPU (not shown) that is remotely located from the hardware being controlled by the CPU 300.

The memory 302 is in the form of computer-readable storage media that contains instructions, that when executed by the CPU 300, facilitates the operation of the temperature control system 134. The instructions in the memory 302 are in the form of a program product such as a program that implements the method of the present disclosure. The program product contains program code that may conform to any one of a number of different programming languages. In one example, the methods described herein may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The controller 140 also includes an input 308 and an output 310. The temperature sensor 136 is connected to the controller 140 via the input 308. The output 310 of the controller 140 is connected to the variable speed blower 138. The variable speed blower 138 blows gas to the surface of the lid 106 to prevent the lid 106 from overheating. The variable speed blower 138 may be set to a percentage of the total power of the variable speed blower 138.

Because not all variable speed blowers 138 operate with the same efficiency level for blowing cool gas, using a direct measurement of the upper dome temperature to adjust the speed of the variable speed blower 138 can compensate for differences among the variable speed blowers. To ensure that any variable speed blower 138 can be outfitted to the housing 104, a control loop feedback mechanism in the form of a controller 140 is implemented.

Figure 4:
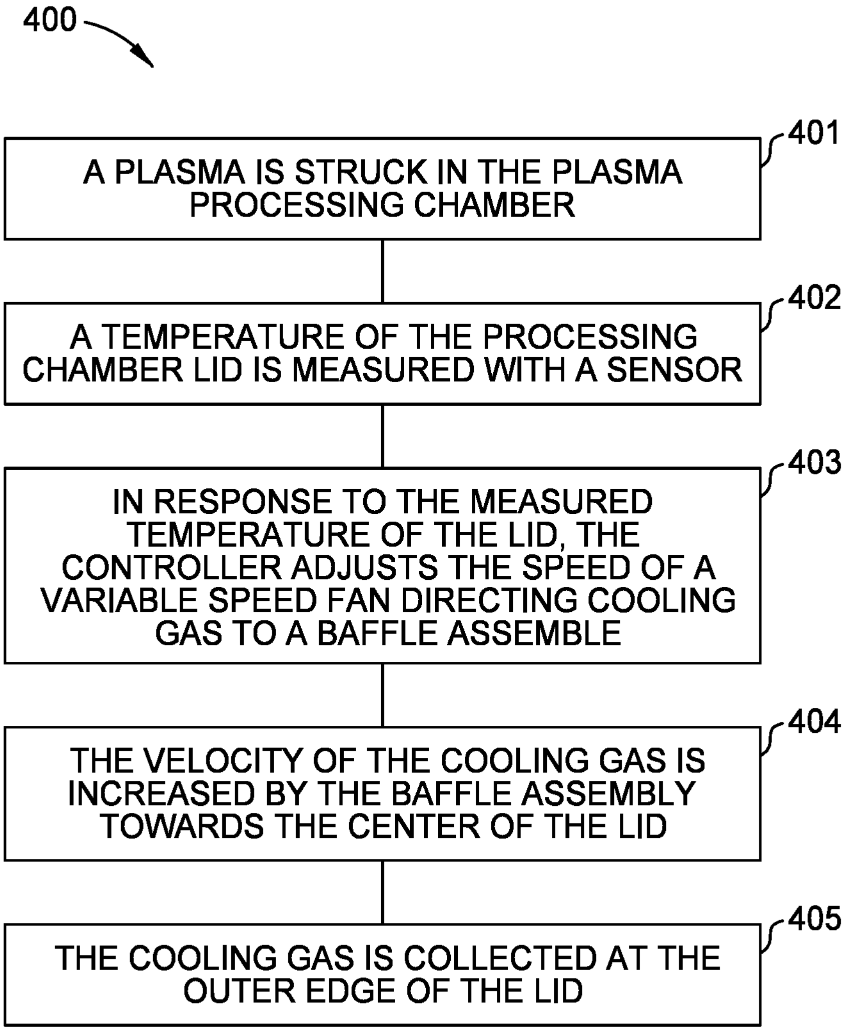
FIG. 4 illustrates a method of using the baffle assembly for cooling a lid of the processing chamber in FIG. 1.

FIG. 4 illustrates a method 400 of using the baffle assembly for cooling a lid of the processing chamber in FIG. 1. The operations of method 400 are cause by a controller in communication with the processing chamber. At operation 401, the lamps direct radiant energy through the lid to the substrate disposed in the plasma processing chamber. The radiant energy preferentially heats a center of the lid over an outer edge of the lid of the processing chamber. At operation 402, a temperature of the processing chamber lid is measure by a sensor. The sensor provides the temperature readings to the controller. At operation 403, in response to the measured temperature of the lid, the controller adjusts the speed of a variable speed fan directing cooling gas, such as air or other suitable gas, to a baffle assembly. At operation 404, the velocity of the cooling gas is increased by the baffle assembly towards the center of the lid. The baffle assembly has a sloped surface of a top baffle directing the cooling gas down and onto a second sloped sidewall of a conical baffle and into to a central opening of the baffle assembly. The central opening is aligned with the center of the lid and directed the cooling air to flow from the center of the lid to an outer edge of the lid. At operation 405, the cooling air exits at the outer edge of the lid. In this manner, the change in temperature of the lid from center to edge can be maintained to less than about 10° Celsius.

Advantageously, the new baffles reduced lid center-to-edge temperature gradients to less than about 10° Celsius compared to over 60° Celsius found in lids of conventional processing chambers. The lower lid temperature gradients results in smaller stresses being present in the lid, which results in a lower probability of lid failure. The lower lid temperature gradients also reduces chamber downtime for preventive maintenance. Furthermore, the reduced lid center-to-edge temperature gradients also improves substrate processing uniformity, resulting in increased throughput and higher quality of the deposited films.

While the foregoing is directed to specific embodiments, other and further embodiments may be devised without departing from the basis scope thereof, and the scope thereof is determined by the claims that follow.

What is claimed is:

1. A baffle assembly configured to direct air flow to an outer edge of a lid of a semiconductor processing system, the baffle assembly comprising:

a baffle center having a side surface and a bottom surface, wherein the bottom surface is ring shaped with a central opening and the baffle center is disposed above a top surface of the lid;

a middle baffle coupled to and extending outward from the side surface of the baffle center;

a conical baffle coupled to and extending inward from the side surface of the baffle center; and a top baffle coupled to and extending upward from the side surface of the baffle center.

2. The baffle assembly of claim 1, wherein the top baffle further comprises:

a lower collar wherein the lower collar is ring shaped and disposed above the side surface of the baffle center; and an angle sidewall extending from the lower collar, wherein the angle sidewall extends from a centerline extending through a center of the central opening and the angled sidewall is at a first angle from the centerline of between about 10° and about 40°.

3. The baffle assembly of claim 2, wherein the conical baffle further comprises:

an inner cylindrical wall;

an outer rim wherein the outer rim is disposed above the side surface of the baffle center; and an angle top surface coupling the inner cylindrical wall to the outer rim, wherein the angle top surface extends from the centerline at a second angle of between about 85° and about 65°.

4. The baffle assembly of claim 3, wherein a third angle between the angle top surface and the angle sidewall is between about 155° and about 105°.

5. The baffle assembly of claim 4, wherein the conical baffle further comprises:

a conical baffle opening defined by the inner cylindrical wall, wherein the conical baffle opening has a diameter which is smaller than the central opening of the baffle center.

6. The baffle assembly of claim 3, wherein the baffle center further comprises:

a rim outward from the side surface, wherein the baffle assembly further comprises:

a spacer similarly sized as the rim of the baffle center and disposed above the rim.

7. A processing chamber for semiconductor processing, the processing chamber comprising:

a chamber body comprising:

a lid having a center; and a lower dome, the lid and the lower dome defining an interior volume of the processing chamber and wherein a centerline of the chamber body extends through the center of the lid and the lower dome; and a temperature control system comprising:

a temperature sensor to measure a temperature of the lid;

two or more blowers;

a controller in communication with the blower and the temperature sensor; and a baffle assembly configured to direct a gas flow from the blowers to a center of the lid and then to an outer edge of the lid, the baffle assembly comprising:

a baffle center having a side surface and a bottom surface, wherein the bottom surface is ring shaped with a central opening and the baffle center is disposed above a top surface of the lid;

a middle baffle coupled to and extending outward from the side surface of the baffle center;

a conical baffle coupled to and extending inward from the side surface of the baffle center; and a top baffle coupled to and extending upward from the side surface of the baffle center.

8. The processing chamber of claim 7, wherein the top baffle further comprises:

a lower collar wherein the lower collar is ring shaped and disposed above the side surface of the baffle center; and an angle sidewall extending from the lower collar, wherein the angle sidewall extends from a centerline extending through a center of the central opening and the angled sidewall is at a first angle from the centerline of between about 10° and about 40°.

9. The processing chamber of claim 8 wherein the conical baffle further comprises:

an inner cylindrical wall;

an outer rim wherein the outer rim is disposed above the side surface of the baffle center; and an angle top surface coupling the inner cylindrical wall to the outer rim, wherein the angle top surface extends from the centerline at a second angle of between about 85° and about 65°.

10. The processing chamber of claim 9, wherein a third angle between the angle top surface and the angle sidewall is between about 155° and about 105°.

11. The processing chamber of claim 9, wherein the conical baffle further comprises:

a conical baffle opening defined by the inner cylindrical wall, wherein the conical baffle opening has a diameter which is smaller than the central opening of the baffle center.

12. The processing chamber of claim 8, wherein the baffle center further comprises:

a rim outward from the side surface, wherein the baffle assembly further comprises:

a spacer similarly sized as the rim of the baffle center and disposed above the rim.

13. The processing chamber of claim 8, wherein top baffle further comprises:

a top edge of the angle sidewall opposite the lower collar, wherein the top edge circumscribes the two or more blowers for directing gas flow onto the angled top surface and into a center of the baffle assembly.

14. The processing chamber of claim 13, further comprising:

an exhaust port extending through the chamber body and disposed above the lid, wherein the gas flow directed by the baffle assembly to the center of the lid is directed by the baffle center to the exhaust port.

15. The processing chamber of claim 14, further comprising:

an outer baffle disposed on an outside of the chamber body adjacent the exhaust port, wherein the gas flow exits the exhaust port and contacts the outer baffle to move the gas flow away from adjacent processing equipment.

* * * * *